(12) United States Patent
Hartzell et al.

(10) Patent No.: US 8,236,571 B2
(45) Date of Patent: *Aug. 7, 2012

(54) METHOD OF MAKING MICRO-PIXELATED FLUID-ASSAY PRECURSOR STRUCTURE

(75) Inventors: John W. Hartzell, Camas, WA (US);
Pooran Chandra Joshi, Vancouver, WA (US); Paul J. Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 993 days.

This patent is subject to a terminal disclaimer.

(21) Appl. No.: 11/827,175

(22) Filed: Jul. 10, 2007

(65) Prior Publication Data

US 2008/0084363 A1    Apr. 10, 2008

Related U.S. Application Data

(60) Provisional application No. 60/849,875, filed on Oct. 6, 2006.

(51) Int. Cl.
*G01N 21/00* (2006.01)
(52) U.S. Cl. .............. 436/164; 436/2; 436/805; 385/15; 385/17; 435/289.1; 435/287.1; 435/288.5; 422/68.1; 422/82.05
(58) Field of Classification Search .......... 345/55; 117/88, 89; 435/6, 287.2
See application file for complete search history.

(56) References Cited

U.S. PATENT DOCUMENTS

| | | | |
|---|---|---|---|
| 5,143,854 A | 9/1992 | Pirrung et al. | |
| 5,514,501 A * | 5/1996 | Tarlov | 430/5 |
| 6,093,302 A | 7/2000 | Montgomery | |
| 6,197,503 B1 * | 3/2001 | Vo-Dinh et al. | 435/6 |
| 6,280,595 B1 | 8/2001 | Montgomery | |
| 6,403,317 B1 * | 6/2002 | Anderson | 435/6 |
| 6,551,784 B2 | 4/2003 | Fodor et al. | |
| 6,605,796 B2 | 8/2003 | Brandinger et al. | |
| 6,794,052 B2 | 9/2004 | Schultz et al. | |
| 6,860,939 B2 * | 3/2005 | Hartzell | 117/43 |
| 6,985,655 B2 | 1/2006 | Yamamoto | |
| 7,125,451 B2 | 10/2006 | Hartzell | |
| 7,128,783 B2 | 10/2006 | Hartzell | |

(Continued)

FOREIGN PATENT DOCUMENTS

JP    3447055    4/2003

(Continued)

OTHER PUBLICATIONS

Noda et al. "Development of Photolithography System with Liquid Crystal Device as Active Mask for Synthesizing DNA Chips", Proceedings of the Japan Society of Mechanical Engineers, Kanto Branch, the Japan Society for Precision Engineering, Ibaraki Conference, 2003, vol. 2003, p. 201-202. Japan.

(Continued)

*Primary Examiner* — Sally Sakelaris
(74) *Attorney, Agent, or Firm* — David C. Ripma, Esq.; Jon M. Dickinson, Esq.

(57) ABSTRACT

A method of producing a precursor, active-matrix, fluid-assay micro-structure including the steps of (1) utilizing low-temperature TFT and Si technology, establishing preferably on a glass or plastic substrate a matrix array of non-functionalized pixels, and (2) preparing at least one of these pixels for individual, digitally-addressed (a) functionalization, and (b) reading out, ultimately, of completed assay results.

1 Claim, 6 Drawing Sheets

U.S. PATENT DOCUMENTS

| | | | |
|---|---|---|---|
| 7,135,070 | B2 | 11/2006 | Hartzell |
| 7,156,916 | B2 | 1/2007 | Hartzell |
| 7,163,822 | B2* | 1/2007 | Yazawa et al. ............. 435/287.2 |
| 2003/0035109 | A1 | 2/2003 | Hartwich et al. |
| 2003/0196590 | A1* | 10/2003 | Hartzell .......................... 117/88 |
| 2003/0196591 | A1* | 10/2003 | Hartzell .......................... 117/88 |
| 2003/0196592 | A1* | 10/2003 | Hartzell .......................... 117/88 |
| 2003/0196593 | A1* | 10/2003 | Hartzell .......................... 117/89 |
| 2003/0219196 | A1* | 11/2003 | Weng et al. ...................... 385/17 |
| 2005/0063870 | A1* | 3/2005 | Fukushima et al. ....... 422/82.05 |
| 2007/0072169 | A1 | 3/2007 | Peyvan et al. |

FOREIGN PATENT DOCUMENTS

| | | |
|---|---|---|
| JP | 2003-322613 | 11/2003 |
| JP | 2004-001200 | 8/2004 |
| JP | 2006-17706 | 1/2006 |
| JP | 2006-504111 | 2/2006 |
| WO | WO 9210092 | 6/1992 |

OTHER PUBLICATIONS

Arntz et al. 2003. "Label-free protein assay based on a nanomechanical cantilever array." *Nanotechnology*. 14:86-90 (5 pp).

Jacobson et al. 1985. "Functionalized Congeners of Adenosine: Preparation of Analogues with High Affinity for $A_1$-Adenosine Receptors" *J. Med. Chem.* 28:1341 (1 p, abstract only).

McGall, et al., Jun. 4, 1997, *Journal of the American Chemical Society*, 119(22).

USPTO Office Action, U.S. Appl. No. 11/827,173, dated Nov. 27, 2009, 14 pages total.

USPTO Office Action, U.S. Appl. No. 11/827,173, dated May 21, 2010, 9 pages total.

USPTO Office Action, U.S. Appl. No. 11/827,173, dated Dec. 8, 2010, 10 pages total.

USPTO Office Action, U.S. Appl. No. 11/827,335, dated Mar. 15, 2010, 20 pages total.

USPTO Office Action, U.S. Appl. No. 11/827,335, dated Aug. 11, 2010, 16 pages total.

USPTO Office Action, U.S. Appl. No. 11/827,174, dated Dec. 3, 2010, 14 pages total.

USPTO Office Action, U.S. Appl. No. 11/827,176, dated Jan. 3, 2011, 14 pages total.

USPTO Office Action, U.S. Appl. No. 11/888,491, dated Jun. 25, 2010, 11 pages total.

USPTO Office Action, U.S. Appl. No. 11/888,491, dated Nov. 15, 2010, 8 pages total.

USPTO Office Action, U.S. Appl. No. 11/827,173, dated Apr. 8, 2011, 11 pages total.

USPTO Office Action, U.S. Appl. No. 11/827,173, dated Aug. 12, 2011, 11 pages total.

USPTO Office Action, U.S. Appl. No. 11/827,335, dated Apr. 12, 2011, 13 pages total.

USPTO Office Action, U.S. Appl. No. 11/827,174, dated Apr. 11, 2011, 14 pages total.

USPTO Office Action, U.S. Appl. No. 11/827,174, dated Aug. 16, 2011, 12 pages total.

USPTO Office Action, U.S. Appl. No. 11/827,176, dated May 31, 2011, 10 pages total.

USPTO Office Action, U.S. Appl. No. 11/888,491, dated Apr. 12, 2011, 11 pages total.

\* cited by examiner

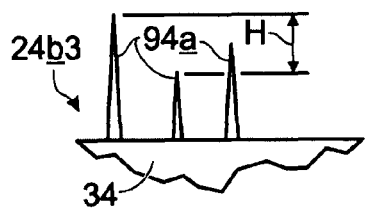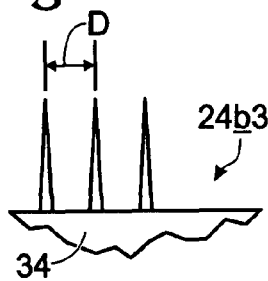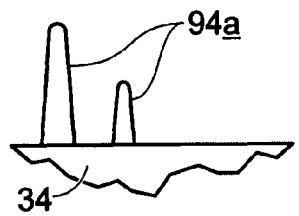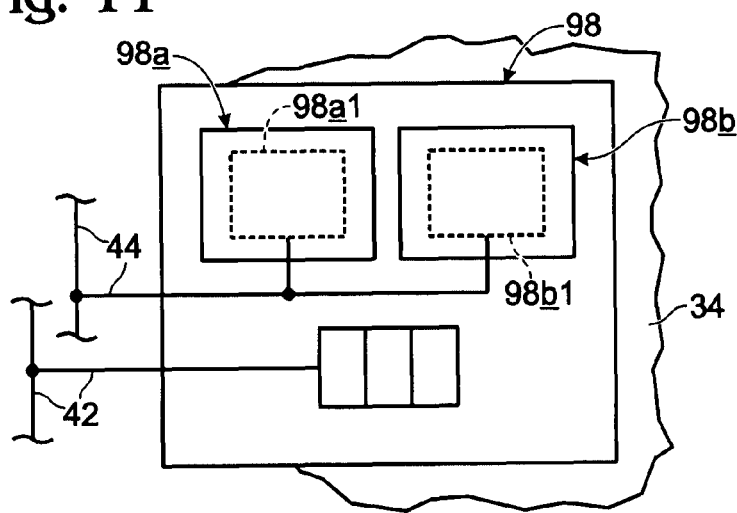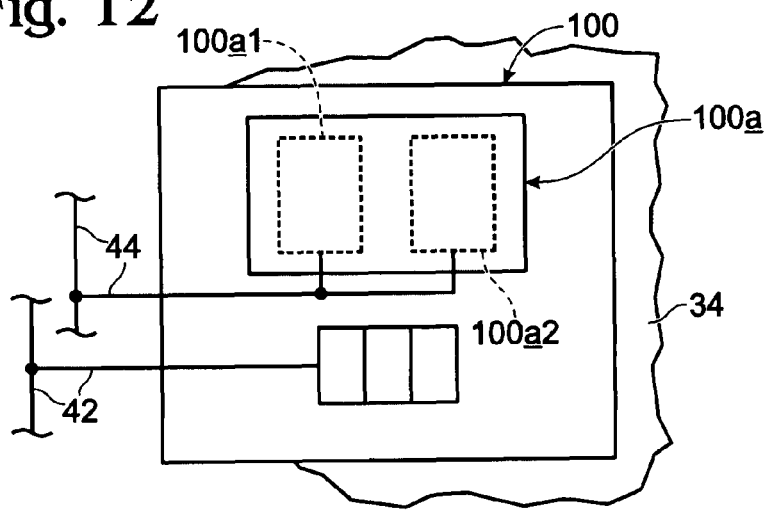

METHOD OF MAKING MICRO-PIXELATED FLUID-ASSAY PRECURSOR STRUCTURE

CROSS REFERENCE TO RELATED APPLICATION

This application claims filing-date priority to U.S. Provisional Patent Application Ser. No. 60/849,875, filed Oct. 6, 2006, for "Micro-Pixelated Array Assay Structure and Methodology". The entire disclosure content of that prior-filed provisional case is hereby incorporated herein by reference.

BACKGROUND AND SUMMARY OF THE INVENTION

This invention relates to a method for producing a pixelated, thin-film-based, fluid-assay, precursor, active-matrix structure, and more particularly to a method for producing a precursor, affinity-lacking, row-and-column micro-structure of active, remotely individually digitally-addressable, affinity-lacking pixels which have been prepared on a supporting substrate as "blank slates" (shortly to be described) for later, selective, assay-specific, assay-site functionalization, by what is referred to herein as an affinity-establishing functionalizer, to enable the performance of at least one kind of a fluid-material assay.

Preferably, the invention takes the form of a method for creating a relatively inexpensive, consumer-level-affordable, thin-film-based, precursor assay structure which features a low-cost substrate that will readily accommodate low-cost, and preferably "low-temperature-condition", fabrication thereon of substrate-supported matrix-pixel "components". "Low temperature" is defined herein as a being a characteristic of processing that can be done on substrate material having a transition temperature (Tg) which is less than about 850° C., i.e., less than a temperature which, if maintained during sustained material processing, would cause the subject material to lose dimensional stability. Accordingly, while the precursor-matrix-pixel technology which is involved with practice of the methodology of this invention, if so desired, can be implemented on more costly supporting silicon substrates, the preferred supporting substrate material employed in the practice of the invention is one made of lower-expense glass or plastic materials. The terms "glass" and "plastic" employed herein to describe a preferred substrate material should be understood to be referring also to other suitable "low-temperature materials. Such substrate materials, while importantly contributing on one level to relatively low, overall, end-precursor-product cost, also allow specially for the compatible employment, with respect to the fabrication of supported precursor pixel structure, of processes and methods that are based on amorphous, micro-crystal and polysilicon thin-film-transistor (TFT) technology. In particular, these substrate materials uniquely accommodate the use of the just-mentioned, low-temperature TFT technology in such a way that electrical, mechanical and electromagnetic thin-film field-creating devices—devices that are included variously in the precursor structure produced by the invention—can be fabricated simultaneously in a process flow which is consistent with the temperature tolerance of such substrate materials.

Regarding the preference herein for the use of low-temperature TFT technology, and briefly describing aspects of that technology, low-temperature TFT devices are formed through deposition processes that deposit silicon-based (or other-material-based, as mentioned below herein, and as referred to at certain points within this text with the expression "etc.") thin film semiconductor material (which, for certain applications, may, of course, later be laser crystallized). This is quite different from classic silicon CMOS device technology that utilizes a single-crystal silicon wafer bulk material as its semiconductor material. While the resulting TFT devices may not have the switching speed and drive capability of transistors formed on single-crystal substrates, TFT transistors can be fabricated cheaply with a relatively few number of process steps. Further, thin-film deposition processes permit TFT devices to be formed on alternate substrate materials, such as transparent glass substrates, for use, as an example, in liquid crystal displays. In this context, it will be understood that low-temperature TFT device fabrication may variously involve the use typically of amorphous Si (a-Si), of micro-crystalline Si, and or of polycrystalline Si formed by low-temperature internal crystalline-structure processing of amorphous Si. Such processing is described in U.S. Pat. No. 7,125,451 B2, the contents of which patent are hereby incorporated herein by reference.

For the sake simply of convenience of expression regarding the present invention, and in order to emphasize the "low-temperature" formation possibility which is associated with the invention in its preferred form, all aspects of assay-matrix pixel fabrication and resulting structure are referred to herein in the context and language of "low-temperature silicon on glass or plastic" construction, and also in the context and language of "low-temperature TFT and Si technology".

Returning now to a general description of the preferred "silicon on glass or plastic" practice features of the present invention, a precursor pixel-matrix structure, which is formed utilizing the above-mentioned low-temperature TFT and Si technology, is created and provided preferably on a glass or plastic substrate, whereby, ultimately, and completely under the control of a recipient-user's selection, each pixel in that created matrix is individually and independently functionalizable to display an affinity for at least one specific fluid-assay material, and following such functionalization, and the subsequent performance of a relevant assay, individually and independently digitally readable to assess assay results. The term "functionalization" herein, and each like term, means preparing a site within a pixel to possess an affinity, i.e., an attraction, for a particular fluid assay material.

The invention thus takes the form of a method for creating an extremely versatile and relatively low-cost assay precursor structure. The precursor structure, also referred to herein interchangeably as a micro-structure, resulting from this method is a precursor structure in the sense, as has just been mentioned above, that it is not yet an assay-material-specific-functionalized assay structure, i.e., it is not yet assay-affinity functionalized with an ability to attract any specific assay material. As will become apparent from the invention description which is provided herein, the structure created by the methodology of this invention is one which is providable, as a singularity, to a user, in a special status which enables that user selectively to functionalize assay sites in its pixels with great versatility, to perform one, or even plural different (as will be explained), type(s) of fluid-material assay(s).

As will be seen, the methodology which is contributed to the state of the relevant sensor assay art by the present invention is a very high-level methodology. In this context, it consists of a unique, high-level organization of steps which are cooperatively linked to produce a unique fluid-assay precursor structure. Detailed features of the several high-level steps involved in the practice of this invention are, or may be, drawn from well-known and conventional practices aimed at producing various micro-structure devices and features, such as semiconductor matrixes, or arrays. The invention does not reside in, or include, any of these feature details. Rather, it resides in the overall arrangement of steps that are capable of leading to the fabrication of the desired, end-result assay precursor micro-structure mentioned above.

With respect to the concept of assay-site functionalization, except for the special features enabled by practice of the present invention that relate (a) to "pixel-specific" functionalization capability, and (b) functionalization under the "control" of a "digitally energized and character-managed", "assay-site-bathing" ambient electromagnetic field of a selected nature, assay-site functionalization is in all other respects essentially conventional in practice. Such functionalization is, therefore, insofar as its conventional aspects are concerned, well known to those generally skilled in the relevant art, and not elaborated herein, but for a brief mention later herein noting the probable collaborative use, in many functionalization procedures, of conventional flow-cell assay-sensor-functional processes.

While ultimately-enabled functionalization specificity for a particular selected assay site (resident within a given pixel), in accordance with practice of the present invention in certain instances, is generally and largely controlled by ambient "bathing" of that site with selected-nature electromagnetic-field energy received from an invention-prepared, digitally-energized, appropriately positionally located, preferably thin-film, electromagnetic field-creating subcomponent, it turns out that site-precision specificity is not a critical operational factor. In other words, it is entirely appropriate if the entirety of a pixel becomes ultimately "functionalized". Accordingly, terminology referring to pixel functionalization and to assay-site functionalization is used herein interchangeably.

While there are many ways in which the core characteristics of this methodologic invention may be visualized and understood, one good way to accomplish this is to focus attention upon the important characteristics of the intended, end-result product of the proposed precursor-structure-producing methodology. Accordingly, we lead into the description of this methodologic invention through a description of that end-result product, with reference made to several embodiments/modifications of such a product. The methodologic steps of the invention are set forth following this product discussion.

One of the first important things to note about the subject end-result product is that it takes the form of a micro-structure pixelated array, or matrix, of active pixels which are designed to be individually, i.e., pixel-specifically, addressed and accessed, for at least two important purposes, by a digital computer. The first of these purposes is to enable user-selectable functionalization of assay sites in pixels to become responsive to particular fluid-assay materials. The second involves implementing user-selectable access to assay-site-functionalized pixels to obtain output readings of responses generated by those pixels regarding the result(s) of a performed fluid-material assay. In this context, the end-result structure generally created by the methodology of this invention acts importantly as a kind of blank slate useable by a user to characterize an entire matrix array, or even simply portions of such an array, for the performance of a specific, or plural specific (different or same), user-chosen fluid-material assay (s).

This blank slate nature of the product resulting from practice of the present invention also leads one to recognize an important analogy that exists between this proposed end-result methodololgic product and those various kinds of well-known commercial products which are considered to be "staples" in commerce, i.e., base products which lie as key ingredients in a vast range of final products into which they are processed and incorporated. The end-result structure coming from practice of the present invention, in the context of its associated field of art and technology regarding fluid-material assays, is indeed such a "staple-like" product.

This analogy, which should clearly stand out very understandably as one reads the full description of the invention practice which is presented herein, directs attention to a key and unique contributed versatility feature that is offered by practice of the methodology of the present invention.

A full description of the preferred and best mode methodology of the invention herein will follow (a) a completion of this introductory text, (b) the then-presented Description of the Drawings, and (c) the thereafter-presented, detailed, end-result product description.

Before continuing, however, certain definitions relating to terminology employed herein are set forth.

The term "active-matrix" as used herein refers to a pixelated structure wherein each pixel is controlled by and in relation to some form of digitally-addressable electronic structure, which structure includes digitally-addressable electronic switching structure, defined by one or more electronic switching device(s), operatively associated, as will be seen, with also-included pixel-specific assay-sensor structure and pixel-bathing electromagnetic field-creating, or functionalizing, structure—all formed preferably by low-temperature TFT and Si technology as mentioned above.

The term "bi-alternate" refers to a possible, user-selectable matrix condition enabled by practice of the present invention, wherein every other pixel in each row and column of pixels may selectively become commonly functionalized for one, specific type of fluid-material assay. This condition effectively creates, across the entire area of an overall matrix made by practice of the invention, two differently and/or separately functionalizable, lower-pixel-count submatrices of pixels (what can be thought of as a two-assay, single-overall-matrix condition).

The term "tri-alternate" refers to a similar condition, but one wherein every third pixel in each row and column may selectively become commonly functionalized for one, specific type of a fluid-material assay. This condition effectively creates, across the entire area of an overall matrix, three, differently and/or separately functionalizable, lower-pixel-count submatrices of pixels (what can be thought of as a three-assay, single-overall-matrix condition).

Individual digital addressability of each pixel permits these and other kinds of lower-pixel-count, submatrix functionalization options, if desired.

Because of the "blank-slate" nature of a precursor micro-structure matrix which results from implementation of the methodology of the present invention, other kinds of submatrices are, of course, possible, and one other type of submatrix arrangement is specifically mentioned hereinbelow.

Whenever a user elects to employ a submatrix functionalization approach regarding an overall matrix made in accordance with the present invention, that approach may be employed to enable either (a) several, successive same-assay-material matrix-assay uses with the same overall matrix, or (b) several successive different-assay-material submatrix-assay uses, also employing the same overall matrix.

It should be apparent, also, that the use of a submatrix functionalization approach with respect to the precursor matrix structure produced by practice of the present invention enables a user to elect to perform selected assays at different pixel-distribution "granularities".

Each prepared "precursor" pixel, which is an active-matrix pixel as that language is employed herein, includes, as was mentioned, at least one, electronically, digitally-addressable assay sensor which is designed to possess, or host, at least one ultimately functionalized, electronically digitally-addressable fluid-assay site that will have and display an affinity for a selected, specific fluid-assay material. Each such pixel also includes, as earlier indicated, an "on-board", digitally-addressable, assay-site-bathing (also referred to as "pixel-bathing"), preferably thin-film, electromagnetic-field-creating structure which, among other things, is controllably energizable, as will be explained, (a) to assist in the functionalization of such a site for the performance of a specific kind of fluid-material assay, and (b) to assist (where appropriate) in the output reading of the result of a particular assay. This pixel-bathing, field-creating structure is capable, via the inclusion therein (by way of practice of the present invention) of suitable, different, field-creating subcomponents, and in accordance with aspects of the present invention, of producing, as a pixel-bathing, ambient field environment within its respective, associated pixel, any one or more of (a) an ambient light field, (b) an ambient heat field, and (c) an ambient non-uniform electrical field.

The invention, as suggested above, thus offers a methodology for producing an extremely flexibly employable, blank-slate, staple-like, pixelated, precursor, fluid-assay, active-matrix structure, or micro-structure, wherein the individual pixels are not initially pre-ordained to function responsively with any specific fluid-assay material, but rather are poised with a readiness to have their respective, associated assay sensors later user-functionalized to respond with specificity to such an assay material.

In the proposed row-and-column arrangement of precursor assay pixels prepared in accordance with the practice of the present invention, each pixel includes a least one, and may include more than one, assay sensor(s), with each such assay sensor being ultimately functionalizable to host, or possess, at least one, but selectively plural, assay-material-specific assay sites that are functionalized appropriately for such materials.

Additionally, and with respect to the issue of ultimate versatility as it relates to the concept regarding submatrices, it is possible for a precursor micro-structure user to create (i.e., functionalize) plural, different, internally unified (all internally alike) subareas (i.e., unified lower-pixel-count submatrices defined by next-adjacent, side-by-side pixels) within an overall, entire matrix, and to functionalize such pixels to respond to one specific type of fluid-assay material, with each such different, internally unified area being functionalized to respond to respective, different assay materials.

It should be understood, regarding functionalization, which, for DNA assay purposes, involves DNA probe-building, that while the end-result structure created by practice of the present invention is built in such a fashion that all addressable, pixel-bathing field-creating functionalization subcomponents within each pixel are remotely digitally addressable to assist in pixel, probe-building functionalization, actual overall functionalization of an assay site on a pixel assay sensor may involve, additionally, and as was mentioned briefly earlier, the utilization of conventional flow-cell processes in order to implement a full correct functionalization procedure. For example, where an assay site in such a pixel is to become functionalized to respond in a DNA-oligonucleotide-probe-type assay, conventional flow-cell technology may be used, in cooperation with probe-building functionalization assistance provided by the on-board field-creating structure, to carry out such full assay-site, DNA probe-building functionalization.

As will become apparent, one especially interesting feature of a precursor matrix micro-structure produced by practice of this invention is that it introduces the possibility of deriving assay-result data, including kinetic assay-reaction data, effectively on or along plural, special axes not enabled by prior art devices. For example, and with respect to the performance, or performances, of a selected, particular type of fluid-material assay, pixels in a group of pixels contained in a full matrix, or in a lower-pixel-count submatrix, may be functionalized utilizing plural different levels, or intensities, of functionalization-assist fields, such as intensity-differentiated heat and/or non-uniform electrical fields. Such differentiated field-intensity functionalization can yield assay-result output information regarding how an assay's results are affected by "field-differentiated" pixel functionalization. Similarly, assay results may be observed by reading pixel output responses successively under different, pixel-bathing ambient electromagnetic field conditions that are then presented seriatim to information-outputting pixels.

Further in relation to the versatile matrix utility enabled ultimately by practice of methodology of the present invention, following user-pixel-functionalization and the performance of a relevant assay, and with respect specifically to the reading-out of completed-assay response information, time-axis output data may easily be gathered on a pixel-by-pixel basis via pixel-specific, digital output sampling.

Regarding the making of a precursor matrix micro-structure as proposed by the present invention, an important point to note, as suggested earlier herein, is that the particular details of the processes, procedures and specific methodologic steps which are employed specifically to fabricate the subject precursor structure may be drawn entirely from conventional micro-array fabrication practices, such as the earlier-mentioned TFT, Si, low-temperature, and low-cost-substrate technology practices, well known to those generally skilled the art. Accordingly, while the high-level, overall organization of cooperative steps proposed by the invention is unique, the details of these steps, which form no part of the present invention, are not set forth herein. Those generally skilled in the relevant art will understand, from a reading of the present specification text, taken along with the accompanying drawing figures, exactly how to practice the present invention, i.e., will be fully enabled by the disclosure material in this text and the accompanying drawings to practice the invention in all of its unique facets.

The various features and advantages of the methodology of the present invention, including those generally set forth above, will become more fully apparent as the description of the invention which now follows below in detail is read in conjunction with the accompanying drawings.

DESCRIPTION OF THE DRAWINGS

FIGS. 10A, 10B and 10C illustrate, in greatly simplified forms, three different kinds of three-dimensional spike features which may be created in the practice of the present invention in relation to what is shown generally in FIGS. 8 and 9 for the production of a non-uniform electrical field.

FIG. 11 provides a fragmentary view, somewhat like that presented in FIG. 1, but here showing a pixel which has been created in accordance with practice of the present invention to include two (plural) assay sensors, each of which is designed to receive and host a single, potential fluid-material assay site.

FIG. 12 is somewhat similar to FIG. 11, except that this figure shows a pixel which has been prepared in accordance with practice of the present invention to include a single fluid-assay sensor which possesses, or hosts, two (plural) potential fluid-material assay sites.

DETAILED DESCRIPTION OF THE INVENTION

Figure 1:
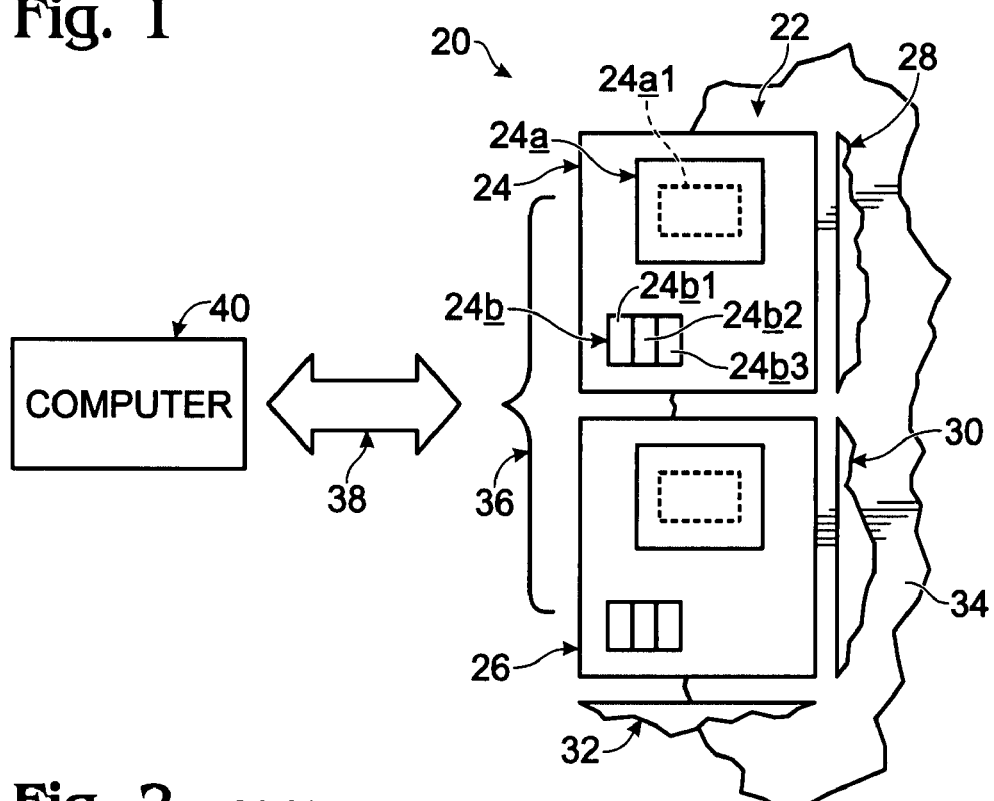
FIG. 1 is a simplified, fragmentary, block/schematic view of a portion of a precursor, digitally-addressable, pixelated, fluid-assay, active-matrix micro-structure formed in accordance with a preferred and best mode manner of practicing the methodology of the present invention.
Figure 2:
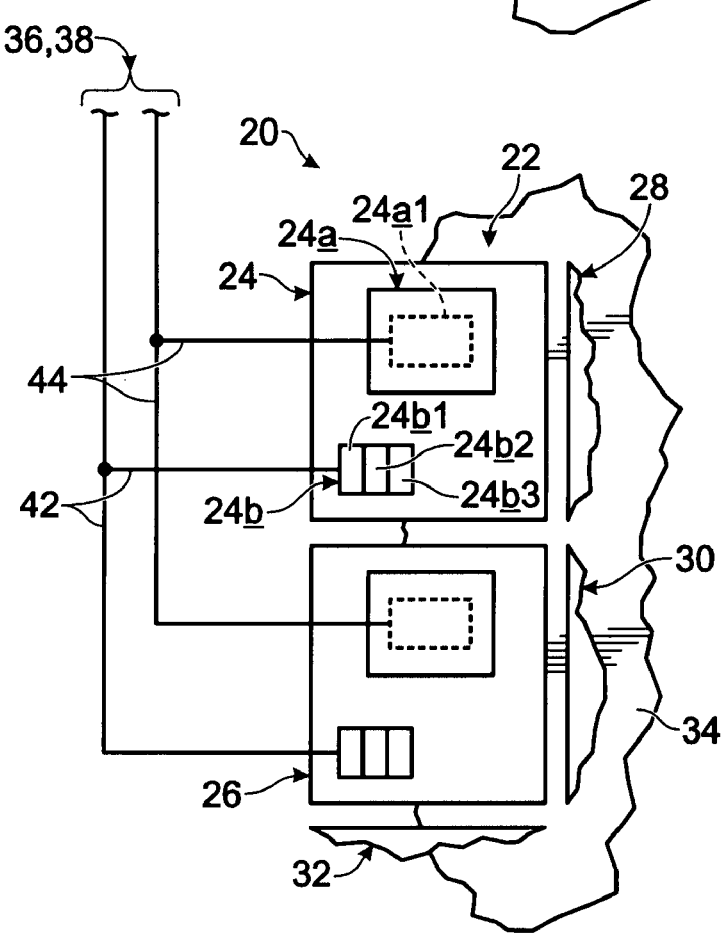
FIG. 2 is similar to FIG. 1, except that it provides a slightly more detailed view of the micro-structure shown in FIG. 1.

Turning attention now to the drawings with a view toward understanding, first of all, the nature of the end-result precursor product which results from implementation of the preferred and best mode manner of practicing the methodology of the present invention, and beginning with FIGS. 1 and 2, indicated generally at 20 is a fragmentary portion of a precursor, digitally-addressable, pixelated, fluid-assay, active-matrix micro-structure. Micro-structure 20 takes the form herein of a column-and-row array 22 of plural, individually externally addressable pixels, such as those shown at 24, 26, 28, 30, 32, formed, as will shortly be described, on an appropriate supporting, conventional-material, preferably glass or plastic, substrate 34. For the purpose of illustration herein, substrate 34 will be considered to be a glass substrate.

As was mentioned earlier herein, the detailed and specific, as distinguished from the high-level, low-cost and low-temperature methodologies and practices which are, or may be, utilized to create the overall precursor structure illustrated in FIGS. 1 and 2 are entirely conventional in nature, are well understood by those generally skilled in the relevant art, and thus may easily be practiced in well-known manners to produce the various structural aspects of micro-structure 20. For example, conventional Si-based, thin-film TFT patterning practices, such as well-known photolithographic practices, may be employed in ways that are familiar to those generally skilled in the art. Additionally, and for certain structures present in micro-structure 20, an internal crystalline-structure processing approach may be employed to create certain desired mechanical characteristics, such as the bending characteristics of a cantilever beam like that pictured in FIG. 7, or the configurations of a collection of material spikes, like that collection which appears in FIGS. 8-10C, inclusive. Such internal crystalline-structure processing methodology is fully described in U.S. Pat. No. 7,125,451 B2, and accordingly, the disclosure content of that patent is hereby incorporated herein by reference in order to provide background information respecting such processing methodology.

In the practice of the present invention, various non-critical dimensions may be chosen, for example, to define the overall lateral size of a precursor micro-structure, such as micro-structure 20. Also, the number of pixels organized into the relevant, overall row-and-column matrix may readily be chosen by one practicing the present invention. As an illustration, a precursor micro-structure, such as micro-structure 20, might have lateral dimensions lying in a range of about 0.4× 0.4-inches to about 2×2-inches, and might include an equal row-and-column array of pixels including a total pixel count lying in a range of about 100 to about 10,000. These size and pixel-count considerations are freely choosable by a practicer of the present invention.

Continuing with a description of what is shown in FIGS. 1 and 2, a bracket 36 and a double-headed, broad arrow 38 (see FIG. 1) represent an appropriate communication/addressing connection, or path, between pixels in micro-structure 20 and a suitable digital computer, such as the computer shown in block form in FIG. 1 at 40. Such a path exists and is employed under circumstances where a precursor micro-structure, such as micro-structure 20, is being (a) functionalized, or (b) "read" after the performance of a fluid-material assay. This inclusion of computer 40 in FIG. 1 has been done to help illustrate and describe the completed precursor-micro-structure utility of the present invention.

Regarding the illustrated operative presence of a digital computer, such as computer 40, it should be understood that such a computer, while "remote and external" with respect to the internal structures of the pixels, per se, might actually be formed directly on-board substrate 34, or might be external to this substrate. In this context, it should be clearly understood that computer presence, location and/or formation are not any part of the present invention.

In the particular preferred and best mode embodiment of precursor micro-structure 20 which is illustrated in FIGS. 1 and 2, which embodiment is fabricated in accordance with preferred and best mode practice of the present invention, each of the mentioned precursor pixels is essentially identical to each other pixel, although, as will later be explained herein, this is not a necessary requirement of the present invention. This "not-necessary" statement regarding the characteristics of the present invention is based upon a clear understanding that there are various end-result fluid-assay applications with respect to which appropriately differentiated precursor pixels might be fabricated in a single, precursor micro-structure array. Some of these differentiated-pixel concepts, and their fabrications, will be discussed and become more fully apparent later herein.

In general terms, and using pixel 24 as an illustration to explain the basic construction of each of the precursor pixels shown in array 22, included in pixel 24 are several, fully integrated, pixel-specific components, or substructures. These include, as part of more broadly inclusive pixel-specific electronic structure, (1) thin-film, digitally-addressable electronic switching structure, (2) a non-functionalized, precursor, individually remotely digitally-addressable and accessible assay sensor $24a$ which hosts a prospective, functionalizable assay site $24a_1$, and (3) what is referred to herein as a pixel-bathing, ambient environmental, electromagnetic-field-creating structure, or affinity-establishing functionalizer, $24b$. Field-creating structure $24b$, which is also remotely, or externally, individually digitally-addressable and accessible, is constructed to create, when energized, any one or more of three different kinds of assay-site-bathing, pixel-bathing, ambient, environmental electromagnetic fields in the vicinity of sensor 24a, including a light field, a heat field, and a non-uniform electrical field. While structure $24b$, as was just mentioned, may be constructed to create one or more of these three different kinds of fields, in the micro-structure pictured in FIGS. 1 and 2, field-creating structure $24b$ has been designed with three field-creating subcomponents $24b_1$, $24b_2$ and $24b_3$. Any one or more of these subcomponents may be energized to create, within pixel 24, an associated pixel-bathing, ambient electromagnetic field condition. Subcomponent $24b_1$ is capable of creating a pixel-bathing light field, subcomponent $24b_2$ a pixel-bathing heat field, and subcomponent $24b_3$ a pixel-bathing non-uniform electrical field. More will be said about these three different kinds of pixel-bathing, field-creating subcomponents shortly.

The use of a bathing electromagnetic field of an appropriate selected character during pixel functionalization, understood by those skilled in the art, and typically used with a functionalizing flow-cell process under way, operates to create, within a pixel and adjacent an assay site, an ambient environmental condition wherein relevant chemical, biochemical, etc. reactions regarding functionalization flow material can take place, at least at the prepared, sensor-possessed assay site, or sites, to ensure proper functionalization at that site. A "prepared assay site" might typically, i.e., conventionally, be defined by a sensor borne area of plated gold.

Given the active-matrix nature of end-result precursor micro-structure 20, prepared as a consequence of practice of the present invention, it should be understood at this point that each precursor pixel is appropriately prepared with one or more conventional electronic switching device(s) (part of the mentioned electronic switching structure) relevant to accessing and addressing its included sensor and assay site, and to energizing its field-creating structure. Illustrations of such devices are given later herein.

Looking for a moment specifically at FIG. 2, indicated generally at 42, 44 are two different communication line systems which are suitably created, and operatively connected to the field-creating structures in the illustrated pixels, and to the assay sensors and assay sites shown in these pixels. The upper, fragmented ends of line systems 42, 44 in FIG. 2 are embraced by a bracket marked with the two reference numerals 36, 38, which bracket represents the previously mentioned "path" of operative connection shown to exist in FIG. 1 between micro-structure 20 and computer 40. Line system 42 is utilized by such a computer to energize pixel-bathing, field-creating subcomponents during a functionalization procedure, and also to energize these same field-creating subcomponents, where appropriate, during reading-out of the results of a performed assay. Line system 44, on a pixel-by-pixel basis, directly couples to computer 40 output responses derived from ultimately functionalized assay sites.

Figure 3:
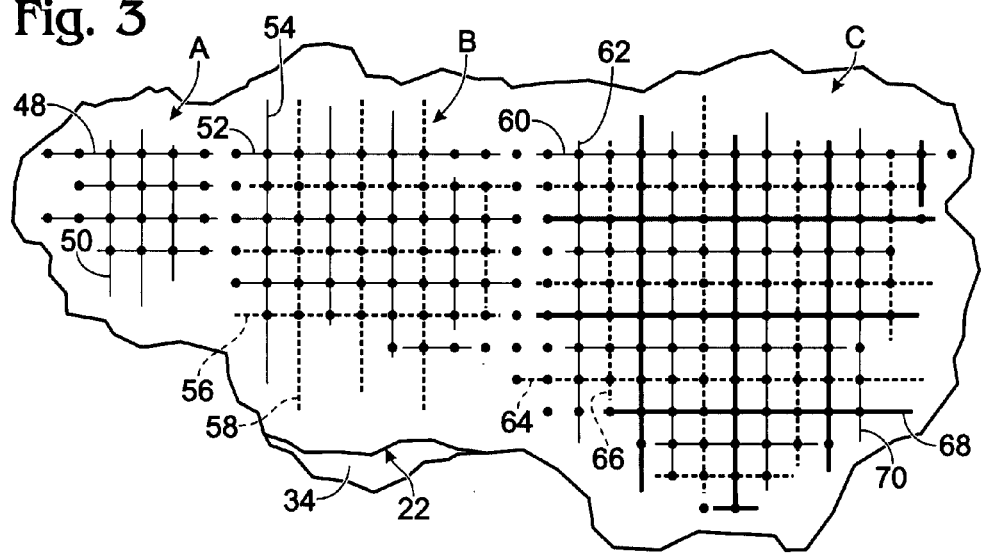
FIG. 3, which is prepared on a somewhat larger scale than those scales employed in FIGS. 1 and 2, illustrates, schematically, different, single-matrix organizational ways in which precursor fluid-assay pixels in the matrix micro-structure prepared by practice of this invention may, user-selectively, be organized into different functionalized arrangements for different fluid-assays that are ultimately to be performed.

Having thus now described generally the arrangement and makeup of a preferred precursor micro-structure fabricated in accordance with practice of the present invention, and having done this in the context of how that structure is illustrated in FIGS. 1 and 2, we now shift attention to FIG. 3 in the drawings. FIG. 3 illustrates several different ways in which ultimately functionalized pixels (i.e., non-precursor pixels), such as fully functionalized versions of the pixels in array 22, may, as enabled by the methodology of the invention, be organized and even differentiated in the hands of a user who is provided with a resulting, fully-rendered (i.e., functionalized) matrix. To begin with, the obvious, large dots, which appear throughout in a row-and-column arrangement in FIG. 3, represent the locations of full-matrix, next-adjacent pixels constructed during practice of this invention. One way of visualizing utilization of the full-matrix precursor structure, as represented by the full array of "dots" in FIG. 3, is to recognize that every pixel thus represented by one of the mentioned dots may be commonly functionalized to respond to a single, specific fluid-assay material.

By way of contrast, marked regions A, B, C in FIG. 3 illustrate three other, representative, possible pixel functionalization patterns (specifically lower-pixel-count, submatrix patterns) that are accommodated by the utility of the present invention.

In region A, which is but a small, or partial, region, or patch, of the overall matrix array 22 of pixels, a functionalized submatrix pattern has been created, as illustrated by solid, horizontal and vertical intersecting lines, such as lines 48, 50, respectively, including rows and columns of next-adjacent pixels, which pixels are all commonly functionalized for a particular fluid-material assay. With this kind of an arrangement, different patches, or fragmentary areas, of next-adjacent pixels may be differently functionalized so that a single matrix array can be used differently with these kinds of patch submatrices to perform, for example, plural, different, fluid-material assays.

In region B, intersecting, solid, horizontal and vertical lines, such as lines 52, 54, respectively, and intersecting, dashed, horizontal and vertical lines, such as lines 56, 58, respectively, illustrate two, different lower-pixel-count, sub-matrix functionalization patterns which fit each into the category mentioned earlier herein as a "bi-alternate" functionalization pattern which effectively creates two, large-area-distribution submatrices within the overall matrix array 22 of pixels. These two pixel submatrices are distributed across the entire area of the overall matrix array, and are characterized by rows and columns of pixels which "sit" two pixel spacings away from one another.

Fig. C illustrates another lower-pixel-count, submatrix functionalization pattern wherein intersecting, light, solid, horizontal and vertical lines, such as lines 60, 62, respectively, intersecting dashed, horizontal and vertical lines, such as lines 64, 66, respectively, and intersecting, thickened, solid, horizontal and vertical lines, such as lines 68, 70, respectively, represent what was referred to herein earlier as a "tri-alternate" functionalization arrangement distributed over the entire matrix array 22 of pixels—effectively dividing that array into three overlapping submatrices.

Those skilled in the art, looking at the illustrative, suggested functionalization patterns illustrated in FIG. 3, will understand how these, and perhaps other, functionalization patterns interestingly tap the utility of the precursor structure prepared by the methodology of the present invention.

Figure 4:
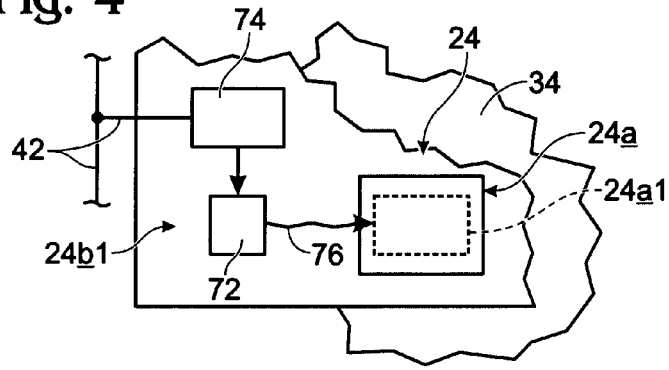
FIG. 4 is a fragmentary, block/schematic diagram illustrating one form of an electromagnetic, pixel-bathing field-creating structure prepared in accordance with practice of the present invention, and specifically such a structure which is intended to create an ambient electromagnetic field environment characterized by light.
Figure 5:
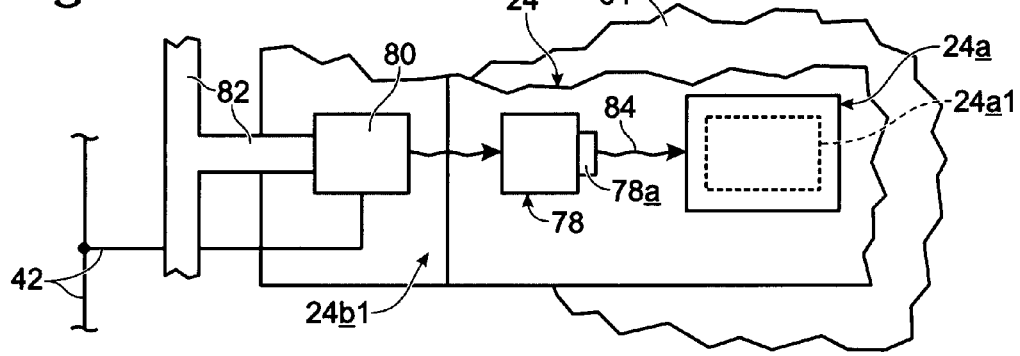
FIG. 5 is similar to FIG. 4, except that it illustrates another pixel-bathing, field-of-light-environment-creating structure.

Turning attention now to FIGS. 4 and 5, these two figures illustrate, schematically and fragmentarily, two different kinds of pixel-bathing, light-field-creating subcomponents creatable in the practice of the invention. These illustrated subcomponents, with respect to what has been shown and discussed earlier herein regarding FIGS. 1 and 2, might sit at the field-creating subcomponent location which is labeled $24b_1$ in FIGS. 1 and 2. FIGS. 4 and 5, in relation to the appearances of things in FIGS. 1 and 2, have been drawn somewhat differently for illustration purposes.

Thus, shown specifically in FIG. 4 is a fabricated, energizable, optical medium 72 which is energized/switched directly by the operation of a control transistor (an electronic switching device) shown in block form at 74. This control transistor has an operative connection to previously mentioned line system 42. A sinuous arrow 76 extends from medium 72 toward prospective assay site $24a_1$ which is hosted on sensor 24a. Arrow 76 schematically pictures the creation of a pixel-bathing, field of light in the vicinity of site $24a_1$.

In FIG. 5, an appropriately constructed optical beam device 78, having a light output port 78a, is switched on and off by means of an optical switching device 80 (an electronic switching device) which is fed light through an appropriately formed optical beam structure 82 which in turn is coupled to an off-pixel source of light. Switching of optical switching device 80 is performed by a computer, such as previously mentioned computer 40, and via previously mentioned line system 42. A sinuous arrow 84 represents a path of light flow to create a pixel-bathing field of light in the vicinity of prospective assay site $24a_1$.

Figure 6:
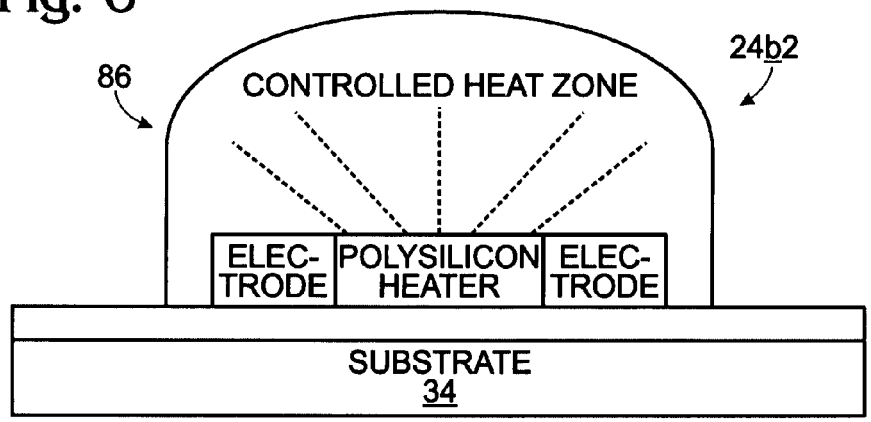
FIG. 6 provides a fragmentary, schematic illustration of one form of a pixel-bathing, heat-field-creating structure.

In each of the possible optical field-creating structures shown in FIGS. 5 and 6, there are different specific arrangements of optical media, well-known to those skilled in the art, which may be built during practice of the invention and employed herein. For example, one such medium might have a horizontal-style configuration, and another arrangement might be characterized by a vertical-style arrangement. Such arrangements are well-known and understood by those skilled in the relevant art.

Figure 7:
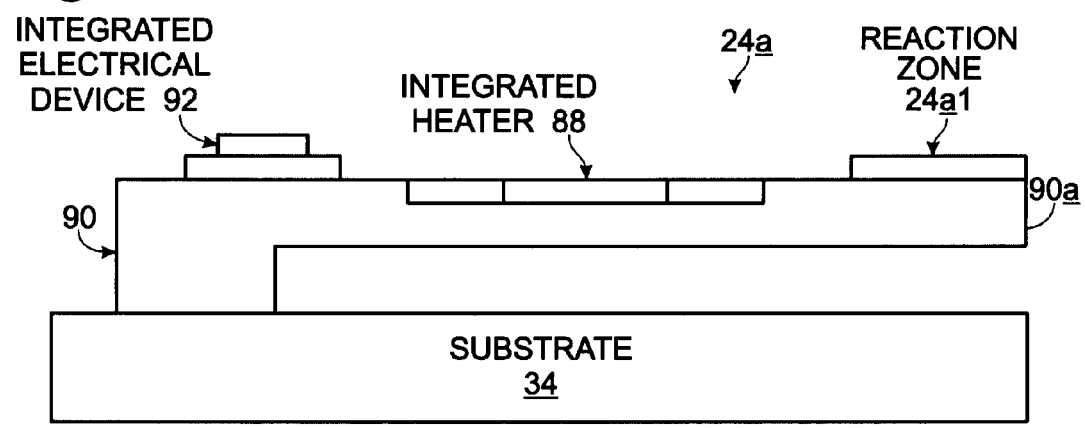
FIG. 7 illustrates fragmentarily another form of a pixel-bathing, heat-field-creating structure which has been prepared on the body of a mechanical cantilever beam which also carries an electrical signaling structure that responds to beam deflection to produce a related electrical output signal.

Directing attention now to FIGS. 6 and 7, here there are illustrated, schematically, two different, electronically switchable, pixel-bathing, heat-field-creating subcomponents, one of which, namely that one which is pictured in FIG. 6, may be used at the location designated $24b_2$ in FIG. 1, and the other of which, namely that one which is shown in FIG. 7, may be used at the location of an on-sensor-24a site 88 which is shown only in FIG. 7. As was mentioned earlier herein, entirely conventional and well-known, or recently introduced (see above-referred-to U.S. Pat. No. 7,125,451 B2 with regard to portions of the structure shown in FIG. 7), specific processes may be employed, in the overall practice of this invention, to produce the switchable heat-field-creating subcomponents illustrated in these two figures.

The first-mentioned version of a heat-field-creating subcomponent is shown generally at 86 in FIG. 6. This subcomponent (86) is also labeled $24b_2$ (in FIG. 6) in order to indicate its relationship to what has already been discussed above regarding the illustrations provided in FIGS. 1 and 2. From a brief look at the schematic illustration presented in FIG. 6, those generally skilled in the relevant art will easily recognize how to fabricate an appropriate, similar heat-field-creating organization. Accordingly, and because of the fact that many different, particular heat-field-creating arrangements may be employed, no specific details for such an arrangement are described or illustrated herein.

The heat-field-creating subcomponent version illustrated generally at 88 in FIG. 7 is one which is shown as having been formed directly adjacent prospective assay site $24a_1$ on a portion of assay sensor 24a, and specifically, formed directly on the beam 90a of a cantilever-type micro-deflection device 90 whose basic material body has been formed specifically utilizing the process mentioned above referred to as internal crystalline-structure processing.

Also formed on beam 90a is an electrical signaling structure 92 which may take the form of any suitable electrical device that responds to bending in beam 90a to produce a related electrical output signal which may be coupled from the relevant pixel ultimately to an external computer, such as computer 40.

Directing attention now to FIGS. 8-10C, inclusive, these figures illustrate various aspects of an electronically switchable, pixel-bathing, non-uniform-electrical-field-creating structure 94 which may be created within a pixel, such as within pixel 24 at the site shown at $24b_3$ in FIGS. 1 and 2. The mechanical spike structures seen in these figures have been fabricated employing the crystalline-structure-processing methodology described in the above-referred-to '451 B2 U.S. patent.

Figure 8:
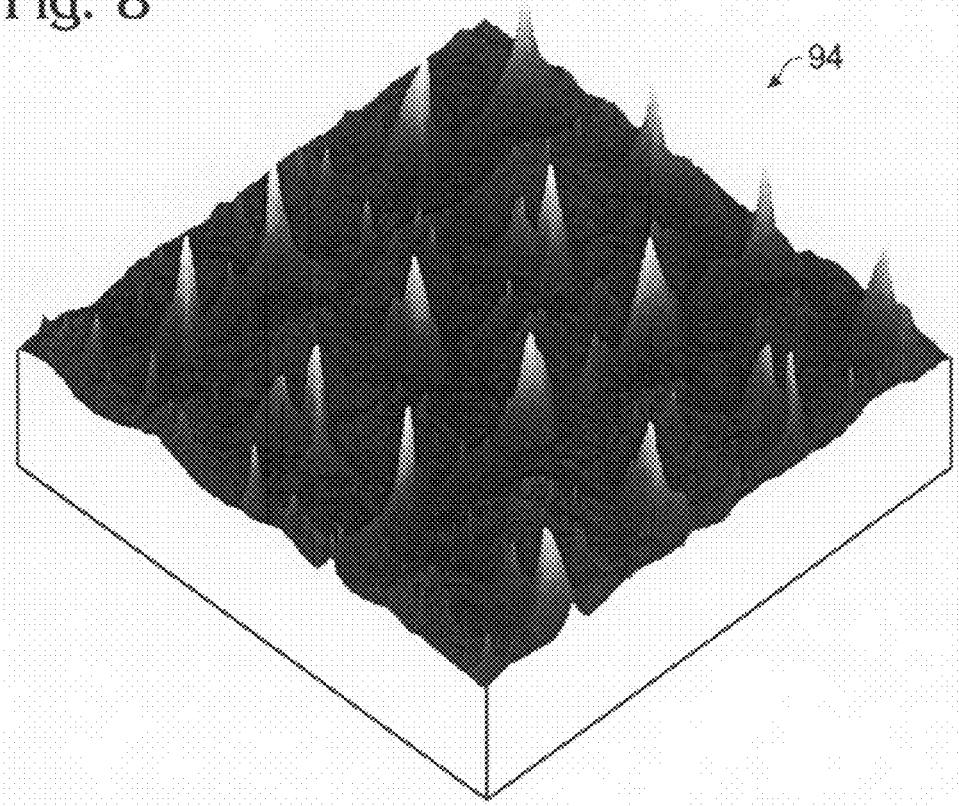
FIG. 8 is an isometric view of a pixel-bathing, non-uniform-electrical-field-creating structure prepared through a recently developed process, touched upon later in this specification, involving internal crystalline-structure processing of substrate material.
Figure 9:
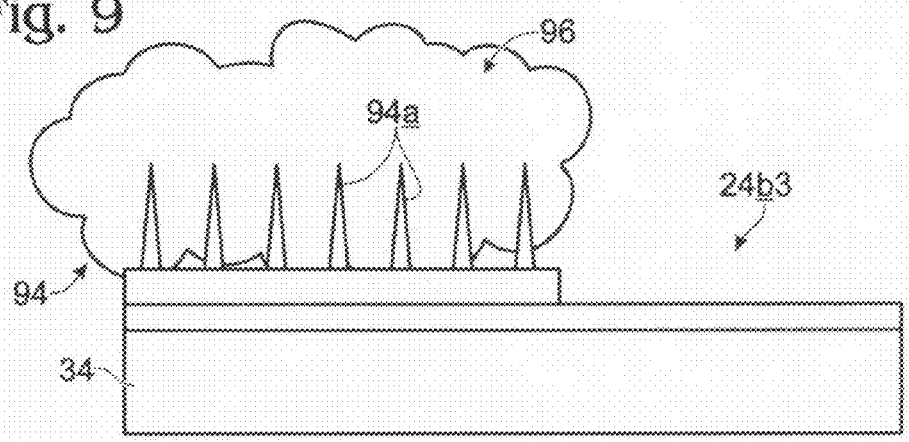
FIG. 9 provides a simplified side elevation of the structure presented in FIG. 8, schematically picturing, also, a pixel-bathing, non-uniform electrical field.

As can be seen in FIGS. 8 and 9, the structure suggested herein for the creation of a non-uniform electrical field takes the form of a sub-array of very slender, approximately equal-height micro-spikes, such as those shown at 94a in FIG. 9, with regard to which electrical energization, as by a computer, such as computer 40, results in the production of an appropriate pixel-bathing, non-uniform electrical field, shown generally and very schematically in a cloud-like fashion at 96 in FIG. 9.

FIGS. 10A, 10B and 10C illustrate several, different, representative micro-spike configurations and arrangements which might be used to characterize a non-uniform electrical field-creating subcomponent. Such micro-spikes are simply illustrative of one of various kinds of different, electronically switchable structures which may be created within a field-creating structure in a pixel to develop, when energized, a suitable, non-uniform electrical field.

FIG. 10A illustrates modified micro-spike structures 94a regarding which distributed micro-spikes may have, either uniformly, or differentially, different heights lying within a user-selectable height range generally indicated at H.

FIG. 10B illustrates an arrangement wherein micro-spikes 94a are configured like those shown in FIGS. 8 and 9, except for the fact that these FIG. 10B micro-spikes are more densely organized, as indicated by next-adjacent, interspike distance D. Such an interspike distance is freely chooseable by a user, and need not be uniform throughout a full sub-array of micro-spikes.

What is illustrated in FIG. 10C is an arrangement wherein the pictured micro-spikes 94a may have several differentiating characteristics, such as differentiating heights and sharpnesses (i.e., pointednesses).

Those skilled in the art will understand that the specific configuration of a non-uniform-electrical-field-creating subcomponent utilizing spikes, such as those just discussed, may be created in any one of a number of different ways.

Addressing attention now to FIGS. 11 and 12, what is shown in FIG. 11 is a modified fragmentary region drawn from the fragmentary illustration of FIG. 1. This figure specifically illustrates a pixel 98, constructed as a part of practice of the present invention, and possessing two assay sensors 98a, 98b, each of which hosts but a single prospective assay site $98a_1$, $98b_1$, respectively.

The modification illustrated in FIG. 12 shows an arrangement wherein a pixel 100, also constructed as a part of practice of the present invention, possesses a single sensor 100a which is structured so as to host two, different, potential assay sites $100a_1$ and $100a_2$.

Turning attention now to FIGS. 13-18, inclusive and respectively, these six figures illustrate the several, key, high-level steps which characterize the preferred and best mode manners of practicing the present invention to produce the precursor micro-structure, and its various unique features, set forth and discussed above. What is shown in these figures, therefore, will be presented now in the context of those key, contributed, methodologic invention steps—recalling that the specifics of these steps' individual implementations may be, and preferably are, carried out in various conventional ways, such as the earlier mentioned, or suggested, micro-structure, photolithographic (and other) patterning and fabrication practices used widely in, for example, the making of all kinds of thin-film, micro-device (e.g., transistor device) structures.

Additionally, and as will be seen, the various drawing-figure-illustrated steps of the invention pictured in these figures, and the associated block/schematic ways presented there for "viewing" of the relevant invention methodology (from somewhat different vantage points, drawing figure by drawing figure), are word-labeled only with the appropriate single words which are the "lead" words of full methodologic statements. These full methodologic statements of the respectively block-diagram-represented method steps are presented completely, however, in the specification text set forth immediately hereinbelow.

From a high-level overview of what is shown regarding the nature of the present invention by FIGS. 13-18, inclusive, collectively, and as is made evident from the text material presented hereinabove, the invention can be seen to be describable as being a method for producing a precursor, active-matrix, fluid-assay micro-structure including the steps of establishing (or alternatively establishing by way of utilizing low-temperature TFT and Si technology) a matrix array of non-functionalized pixels, and preparing at least one of these pixels for individual, digitally-addressed (a) functionalization, and (b) reading out, ultimately, of completed assay results.

This method overview can also be seen, from a slightly more specific point of view, to be one wherein the preparing step includes providing each pixel in the established array with a digitally-addressable (1) non-functionalized assay sensor, and (2) independent, electromagnetic field-creating structure disposed adjacent that pixel. Even more specifically, the invention, from this point of view, may be seen as utilizing low-temperature TFT and Si technology to implement the providing step on and in relation to a glass or plastic substrate.

Figure 13:
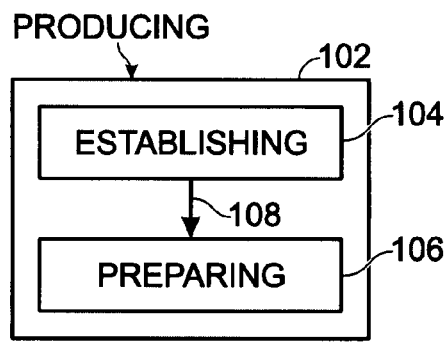
FIGS. 13-18 provide block/schematic diagrams illustrating the various methodological steps which characterize the preferred and best mode manner of practicing the present invention.

Looking now more particularly at what appears in FIGS. 13-18, inclusive, FIG. 13, which includes blocks, or steps, 102 (PRODUCING), 104 (ESTABLISHING) and 106 (PREPARING) provides another kind of overview, even somewhat more specific than what was just stated immediately above, of the methodology of the present invention. In this setting, blocks(steps) 104, 106 are shown to be functionally included within block(step) 102, and interconnected therein by a sequence-indicating arrow 108.

In relation to what is shown visually in FIG. 13, and with appropriate reference made back to the structural discussion provided earlier herein, the invention, as here illustrated, can be expressed verbally as a method for PRODUCING (step 102) a remotely digitally-addressable, pixelated, precursor, active-matrix, fluid-assay micro-structure, including the steps of (a) ESTABLISHING (step 104), on a supporting substrate, an array of plural, non-assay-functionalized pixels, and then (b) PREPARING (step 106) each established pixel with electronically digitally-addressable electronic structure designed to effect, for and with respect to that pixel, and under the selection and control of a user, at least one of (a) selective, independent, fluid-assay-material-specific functionalization, and (b) assay-result output reading, utilizing, at least in part, communicative, electronic interaction between that pixel and a digital computer.

Figure 14:
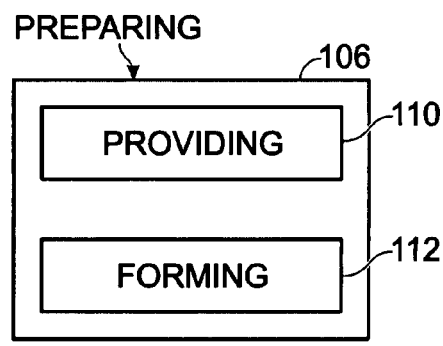

FIG. 14 further pictures the step of electronic-switching-structure PREPARING, i.e., block 106. More specifically, this electronic-switching-structure PREPARING step is shown to include the companion, but not necessarily sequential, blocks, or steps, 110 (PROVIDING) and 112 (FORMING).

In the language of words, FIG. 14 effectively describes the invention as taking the form of what is expressed in and by FIG. 13, wherein, further, the PREPARING step, block 106, includes (a) PROVIDING (step 110) each pixel with at least one electronically, digitally-addressable assay sensor operatively connected to also provided electronically digitally-addressable electronic switching structure, and constructed to host at least one electronically, digitally-addressable, ultimately functionalizable assay site, and (b) FORMING (step 112) within each pixel an electronically, digitally-addressable electromagnetic field-creating structure also operatively connected to the also provided electronic switching structure, and which is selectively energizable by the mentioned computer to participate in at least one of (1) pixel functionalization, and (2) assay-result output reading with regard to a functionalized pixel.

Figure 15:
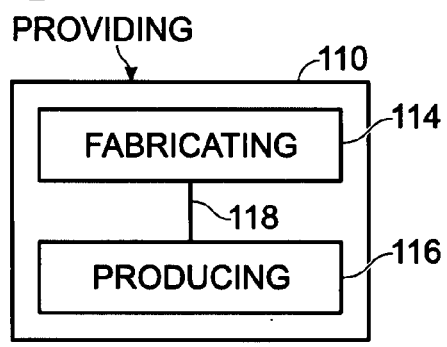

FIG. 15 relates to FIG. 14 in somewhat, though not completely, the same manner that FIG. 14 relates to FIG. 13, in the sense that FIG. 15 further characterizes the methodology of the invention expressed in FIG. 14 by describing something more about the included functional content of one of the blocks/steps pictured in FIG. 14. In particular, FIG. 15 further characterizes the invention by elaborating the functional content of the step of PROVIDING, i.e., block 110—indicating that the PROVIDING step includes, as will be more fully set forth below, the step of FABRICATING (block 114), and additionally includes the further step of PRODUCING (block 116). A connecting line 118 indicates the just-mentioned "further step" relationship between blocks 114, 116.

Thus, in narrative form, FIG. 15 illustrates that, with respect to the invention as pictured in FIG. 14, the PROVIDING of each pixel with the mentioned at least one electronically digitally-addressable assay sensor includes FABRICATING that sensor within the pixel as a micro-deflection device. FIG. 15 also illustrates that the step of PROVIDING further includes the step of PRODUCING, on the fabricated micro-deflection device, a remotely, electronically, digitally-addressable electrical signaling structure which is operable to generate an electrical signal related to deflection of the micro-deflection device.

Figure 16:
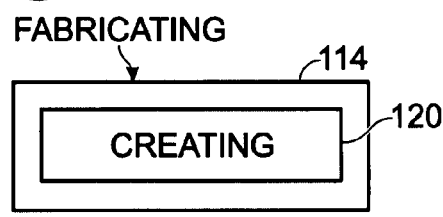

FIG. 16, in pictured blocks/steps 114, 120 illustrates that the step of FABRICATING (block 114) the mentioned micro-deflection device takes the form of CREATING (block 120) a cantilever structure.

Figure 17:
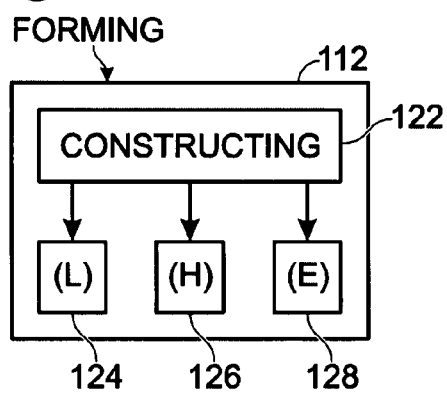

FIG. 17 employs blocks/steps 112 (FORMING) and 122 (CONSTRUCTING), along with "produced-precursor-structure" blocks 124, 126, 128 (still to be described), to elaborate, somewhat, the functional content of the step of FORMING within each pixel an electronically, digitally-addressable electromagnetic field-creating structure. In particular, FIG. 17 describes the functional condition that the step of FORMING a field-creating structure includes CONSTRUCTING, within each pixel, at least one of (a) a light-field-creating (L) subcomponent (block 124), (b) a heat-field-creating (H) subcomponent (block 126), and (c) a non-uniform-electrical-field-creating (E) subcomponent(block 124) (block 128).

Figure 18:
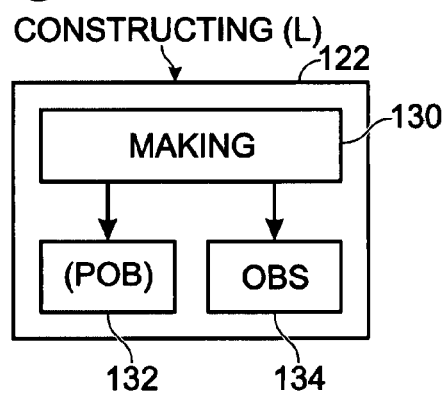

Finally, FIG. 18 further characterizes the CONSTRUCTING (L) step (blocks 122, 124) of the invention by pointing out that it can take two different forms of a step referred to as MAKING (block 130). More specifically, the step of CONSTRUCTING (L) (blocks 122, 124) of a light-field-creating subcomponent involves the MAKING either of a pixel on-board light (POB) source, block 132, or of a pixel-communicative, on-substrate, optical beam structure (OBS), block 134, adapted for optical coupling to an off-pixel light source.

Thus, a unique, high-level methodologic practice for producing a likewise unique, precursor ("blank-slate-style"), pixelated, active-matrix, fluid-assay micro-structure, useable ultimately in a fluid-material assay, has been illustrated and described. This invention methodology produces such a micro-structure whereby ultimately, and completely under the control of a matrix-recipient-user's selection, each pixel in that produced precursor matrix is individually and independently functionalizable to display an affinity for at least one specific fluid-assay material, and following such functionalization, and the subsequent performance of a relevant assay, individually and independently digitally readable to assess assay results.

The precursor matrix structure made by practice of the methodology of the invention utilizes, preferably, a low-cost substrate material, such as glass or plastic, and features, also preferably, the low-temperature fabrication on such a substrate of supported pixel structures, including certain kinds of special internal components or substructures, all formed preferably by TFT and Si technology as discussed above. Thus one can think about this invention as involving, preferably, silicon on glass or plastic technology.

The unique matrix which is created by practice of the methodology of the present invention has the characteristics of a "staple" in commerce—a key factor which contributes to its special, end-result versatility with respect to how it can freely be functionalized in many ways by a user for employment in a fluid-material assay. Fabrication of the described precursor matrix to possess independent digital addressability of each pixel, and further to include special pixel-bathing, ambient electromagnetic field-creating structure, introduces interesting opportunities to a user (not offered by the prior arts) for preparing to conduct, and ultimately for conducting, such assays in many new ways, including ways that include examining assay results on kinetic and time-based axes of information.

And, very specially, depending upon how user-performed pixel functionalization is ultimately done (as enabled by the fabrication methodology contributed to the art by the present invention), a single matrix may be user-employed in "one-to-many" fluid-material assays.

Accordingly, while a preferred and best mode manner of practicing the methodology of the invention have been described and suggested herein, and certain variations and modifications thereof discussed, it is understood that additional variations and modifications may also be made which will come within proper spirit and scope of the invention.

We claim:

1. A method of producing, as an intended, end-result product, a non-functionalized, active-matrix, precursor DNA fluid-assay micro-structure comprising providing a single supporting substrate having a surface, forming in common on that surface plural TFT-technology-fabricated pixels, each including (a) an assay site, and (b) disposed on the substrate surface, operatively and laterally adjacent the formed assay site, an energizable, light-field-creating structure including (1) a switching transistor, and (2) a light-field-generating optical medium operatively connected to, and energizable by operation of, the transistor, the optical medium being structured, when energized by operation of the transistor, to create, from, and adjacent, its location on the substrate surface, and to bathe the assay site with, an ambient light field which is operable to assist in performing subsequent DNA fluid-assay sensor-probe creation on the assay site, and by said providing and forming, completing the intended, end-result product.

\* \* \* \* \*